(12) United States Patent
Li et al.

(10) Patent No.: US 11,889,721 B2
(45) Date of Patent: Jan. 30, 2024

(54) DISPLAY SUBSTRATE, MANUFACTURING METHOD THEREOF AND DISPLAY DEVICE

(71) Applicants: Ordos Yuansheng Optoelectronics Co., Ltd., Inner Mongolia (CN); BOE Technology Group Co., Ltd., Beijing (CN)

(72) Inventors: Feng Li, Beijing (CN); Yezhou Fang, Beijing (CN)

(73) Assignees: ORDOS YUANSHENG OPTOELECTRONICS CO., LTD., Inner Mongolia (CN); BOE TECHNOLOGY GROUP CO., LTD., Beijing (CN)

( * ) Notice: Subject to any disclaimer, the term of this patent is extended or adjusted under 35 U.S.C. 154(b) by 234 days.

(21) Appl. No.: 16/768,168

(22) PCT Filed: Jul. 16, 2019

(86) PCT No.: PCT/CN2019/096139
§ 371 (c)(1),
(2) Date: May 29, 2020

(87) PCT Pub. No.: WO2021/007769
PCT Pub. Date: Jan. 21, 2021

(65) Prior Publication Data
US 2021/0408186 A1 Dec. 30, 2021

(51) Int. Cl.
*H01L 27/32* (2006.01)
*H01L 51/00* (2006.01)
(Continued)

(52) U.S. Cl.
CPC ..... *H10K 59/123* (2023.02); *G02F 1/136227* (2013.01); *H01L 27/1259* (2013.01);
(Continued)

(58) Field of Classification Search
CPC ............ G02F 1/1368; G02F 1/136227; H01L 29/78669; H01L 29/78678;
(Continued)

(56) References Cited

U.S. PATENT DOCUMENTS 5,818,550 A * 10/1998 Kadota ............. G02F 1/133514
349/122
5,868,951 A * 2/1999 Schuck, III ....... G02F 1/136277
349/122
(Continued)

FOREIGN PATENT DOCUMENTS

CN 1901208 A 1/2007
CN 1992295 A * 7/2007 ......... G02F 1/13458
(Continued)

OTHER PUBLICATIONS

Machine translation, Cai, Chinese Pat. Pub. No. CN 104656328, translation date: Feb. 12, 2022, Espacenet, all pages. (Year: 2022).*
(Continued)

*Primary Examiner* — Victoria K. Hall
(74) *Attorney, Agent, or Firm* — Lippes Mathias LLP

(57) ABSTRACT

A method of manufacturing a display substrate includes: forming a switch unit on a base substrate; forming a planarization layer on one side of the switch unit away from the base substrate, wherein a region, corresponding to an output electrode, of the planarization layer is provided with a planarization layer via hole, and an orthographic projection of the planarization layer via hole onto the base substrate is located within an orthographic projection region of the output electrode onto the base substrate; etching a surface of a region, corresponding to the planarization layer via hole, of the output electrode; and forming a pixel electrode on one side of the planarization layer away from the switch unit, (Continued)

wherein the pixel electrode is in contact with the output electrode through the planarization layer via hole.

4 Claims, 8 Drawing Sheets

(51) Int. Cl.
| | |
|---|---|
| *H01L 51/56* | (2006.01) |
| *H10K 59/123* | (2023.01) |
| *G02F 1/1362* | (2006.01) |
| *H10K 59/124* | (2023.01) |
| *H10K 71/00* | (2023.01) |
| *H10K 71/20* | (2023.01) |
| *H01L 27/12* | (2006.01) |
| *G02F 1/163* | (2006.01) |
| *H10K 59/12* | (2023.01) |
| *G02F 1/1333* | (2006.01) |

(52) U.S. Cl.
CPC ....... *H01L 27/1288* (2013.01); *H10K 59/124* (2023.02); *H10K 71/00* (2023.02); *H10K 71/231* (2023.02); *G02F 1/133357* (2021.01); *G02F 2001/1635* (2013.01); *G02F 2201/123* (2013.01); *H10K 59/1201* (2023.02); *H10K 71/233* (2023.02)

(58) Field of Classification Search
CPC ............ H01L 29/66765; H01L 29/458; H01L 27/3258; H01L 27/3248; H10K 59/123
See application file for complete search history.

(56) References Cited

U.S. PATENT DOCUMENTS

| | | | | | |
|---|---|---|---|---|---|
| 6,072,450 | A | * | 6/2000 | Yamada | H01L 27/3244 313/500 |
| 6,337,723 | B1 | * | 1/2002 | Bae | G02F 1/13624 438/149 |
| 11,488,988 | B2 | * | 11/2022 | Song | H01L 27/1255 |
| 2005/0253171 | A1 | * | 11/2005 | Kang | H01L 27/3258 257/211 |
| 2007/0019122 | A1 | * | 1/2007 | Lee | H01L 29/458 257/E29.147 |
| 2009/0295747 | A1 | * | 12/2009 | Hsieh | G06F 3/0412 345/173 |
| 2010/0136775 | A1 | * | 6/2010 | Choi | H01L 27/1225 438/585 |
| 2011/0037068 | A1 | * | 2/2011 | Yamazaki | H01L 29/78603 257/E29.296 |
| 2013/0200401 | A1 | * | 8/2013 | Takeuchi | H01L 27/3248 438/624 |
| 2014/0042444 | A1 | * | 2/2014 | Huang | H01L 27/1288 438/34 |
| 2015/0060857 | A1 | * | 3/2015 | Jung | H01L 27/1288 438/34 |
| 2015/0155310 | A1 | * | 6/2015 | Lee | H01L 29/78696 257/43 |
| 2015/0262536 | A1 | * | 9/2015 | Chen | G02F 1/13394 345/92 |
| 2015/0364507 | A1 | * | 12/2015 | Won | G06F 3/0412 257/43 |
| 2016/0043226 | A1 | * | 2/2016 | Yoon | H01L 27/124 349/47 |
| 2016/0274695 | A1 | * | 9/2016 | Ando | G02B 1/113 |
| 2016/0357314 | A1 | * | 12/2016 | Liu | G06F 3/0412 |
| 2017/0154905 | A1 | * | 6/2017 | Yuan | H01L 21/34 |
| 2017/0345882 | A1 | * | 11/2017 | Nam | H01L 27/3258 |
| 2018/0097049 | A1 | * | 4/2018 | Choi | H01L 27/3246 |
| 2018/0166471 | A1 | * | 6/2018 | Wang | H01L 29/66969 |
| 2018/0166521 | A1 | * | 6/2018 | Bae | H01L 27/3248 |
| 2018/0203281 | A1 | * | 7/2018 | Zhang | H01L 27/12 |
| 2018/0226438 | A1 | * | 8/2018 | Liu | H01L 29/66757 |
| 2019/0244982 | A1 | * | 8/2019 | Lu | G06F 3/0443 |
| 2020/0286781 | A1 | * | 9/2020 | Hsieh | H01L 21/76895 |
| 2021/0020755 | A1 | * | 1/2021 | Yan | H01L 29/66757 |

FOREIGN PATENT DOCUMENTS

| | | | | | |
|---|---|---|---|---|---|
| CN | 101211781 | A | * | 7/2008 | ............. H01L 21/28 |
| CN | 101556415 | A | | 10/2009 | |
| CN | 103367165 | A | * | 10/2013 | ......... H01L 27/1262 |
| CN | 203312302 | U | * | 11/2013 | ........... G02F 1/1362 |
| CN | 103928475 | A | | 7/2014 | |
| CN | 104656328 | A | * | 5/2015 | ....... G02F 1/136213 |
| CN | 106910750 | A | | 6/2017 | |
| CN | 108183108 | A | * | 6/2018 | ......... H01L 21/1296 |
| CN | 110289285 | A | * | 9/2019 | ............. H10K 59/00 |
| KR | 10-2005-0100950 | A | * | 10/2005 | ............... G07D 7/04 |

OTHER PUBLICATIONS

Machine translation, Kang, Korean Pat. Pub. No. KR10-2005-0100950A, translation date: Jun. 21, 2022, Espacenet, all pages. (Year: 2022).*
Machine translation, Kim, Chinese Pat. Pub. No. CN1992295A, translation date: Mar. 22, 2023, Espacenet, all pages. (Year: 2023).*
Machine translation, Zhu, Chinese Pat. Pub. No. CN-101211781-A, translation date: Jul. 5, 2023, Clarivate Analytics, all pages. (Year: 2023).*
Machine translation, Yan, Chinese Pat. Pub. No. CN-103367165-A, translation date: Jul. 5, 2023, Clarivate Analytics, all pages. (Year: 2023).*
Machine translation, Yan, Chinese Pat. Pub. No. CN-203312302-U, translation date: Jul. 5, 2023, Clarivate Analytics, all pages. (Year: 2023).*
Machine translation, Luo, Chinese Pat. Pub. No. CN-108183108-A, translation date: Jul. 5, 2023, Espacenet, all pages. (Year: 2023).*
Machine translation, Wang, Chinese Pat. Pub. No. CN-110289285-A, translation date: Jul. 5, 2023, Espacenet, all pages. (Year: 2023).*
International search report of PCT application No. PCT/CN2019/096139 dated Apr. 15, 2020.

* cited by examiner

DISPLAY SUBSTRATE, MANUFACTURING METHOD THEREOF AND DISPLAY DEVICE

The present application is a 371 of PCT Application No. PCT/CN2019/096139, filed on Jul. 16, 2019, the contents of which are incorporated herein by reference in their entirety.

TECHNICAL FIELD

The present disclosure relates to the field of display technologies, and more particularly, relates to a display substrate, a manufacturing method thereof and a display device.

BACKGROUND

A display substrate generally includes a base substrate and a thin film transistor (TFT), a planarization layer and a pixel electrode on the base substrate, wherein the pixel electrode is connected to a drain electrode of the TFT through a via hole in the planarization layer.

SUMMARY

Embodiments of the present disclosure provide a display substrate, a manufacturing method thereof and a display device. The technical solutions are as follows.

In one aspect, a method for manufacturing a display substrate is provided. The method includes:

forming a switch unit on a base substrate, wherein the switch unit includes an output electrode;

forming a planarization layer on one side of the switch unit away from the base substrate, wherein a region, corresponding to the output electrode, of the planarization layer is provided with a planarization layer via hole, and an orthographic projection of the planarization layer via hole onto the base substrate is located within an orthographic projection region of the output electrode onto the base substrate;

etching a surface of a region, corresponding to the planarization layer via hole, of the output electrode; and forming a pixel electrode on one side of the planarization layer away from the switch unit, wherein the pixel electrode is in contact with the output electrode through the planarization layer via hole.

Optionally, the etching the surface of the region, corresponding to the planarization layer via hole, of the output electrode includes:

etching the surface of the region, corresponding to the planarization layer via hole, of the output electrode by using the planarization layer as a mask.

Optionally, before forming the planarization layer on one side of the switch unit away from the base substrate, the method further includes:

forming a passivation layer on one side of the switch unit away from the base substrate;

the forming the planarization layer on one side of the switch unit away from the base substrate includes:

forming the planarization layer on one side of the passivation layer away from the switch unit, wherein a region, corresponding to the output electrode, of the passivation layer is exposed through the planarization layer via hole;

the etching the surface of the region, corresponding to the planarization layer via hole, of the output electrode by using the planarization layer as the mask includes:

over-etching the region, exposed through the planarization layer via hole, on the passivation layer by using the planarization layer as the mask, so as to form a passivation layer via hole in the passivation layer, and etching the surface of the region, corresponding to the planarization layer via hole, of the output electrode, wherein the passivation layer via hole communicates with the planarization layer via hole, and an orthographic projection of the passivation layer via hole onto the base substrate is located within the orthographic projection region of the planarization layer via hole onto the base substrate; and the forming the pixel electrode on one side of the planarization layer away from the switch unit, wherein the pixel electrode is in contact with the output electrode through the planarization layer via hole includes:

forming the pixel electrode on one side of the planarization layer away from the switch unit, wherein the pixel electrode is in contact with the output electrode through the planarization layer via hole and the passivation layer via hole.

Optionally, opening area of the planarization layer via hole and opening area of the passivation layer via hole at the communicated interface coincide with each other.

Optionally, the over-etching the region, exposed through the planarization layer via hole, of the passivation layer by using the planarization layer as the mask includes:

over-etching the region, exposed through the planarization layer via hole, on the passivation layer through a dry etching process by using the planarization layer as the mask.

Optionally, the output electrode is exposed through the planarization layer via hole, and the etching the surface of the region, corresponding to the planarization layer via hole, of the output electrode by using the planarization layer as the mask includes:

etching the surface of the region, exposed through the planarization layer via hole, of the output electrode through a wet etching process by using the planarization layer as the mask.

Optionally, after forming the planarization layer on one side of the switch unit away from the base substrate, the method further includes:

curing the planarization layer for a target duration, wherein the target duration is less than or equal to 30 minutes.

Optionally, the switch unit is a thin film transistor, and the forming the switch unit on the base substrate includes:

forming a gate electrode, a gate insulating layer, an active layer and a source-drain electrode layer on the base substrate, wherein the source-drain electrode layer includes a source electrode and a drain electrode, and the drain electrode is the output electrode.

Optionally, the method further includes:

forming an insulating layer and a common electrode sequentially on one side of the pixel electrode away from the planarization layer.

Optionally, the common electrode is a plate electrode and the pixel electrode is a strip electrode.

In another aspect, a display substrate is provided. The display substrate is manufactured by the method according to any one of the aforesaid aspect. The display substrate includes:

a base substrate;

a switch unit on the base substrate, wherein the switch unit includes an output electrode, one side of the output electrode away from the base substrate is provided with a groove, and a depth of the groove is between 50 and 300 angstroms;

a planarization layer on one side of the switch unit away from the base substrate, wherein a region, corresponding to the output electrode, of the planarization layer is provided with a planarization layer via hole, and an orthographic projection of the planarization layer via hole onto the base substrate is located within an orthographic projection region of the output electrode onto the base substrate; and a pixel electrode on one side of the planarization layer away from the switch unit, wherein the pixel electrode is in contact with a bottom surface of the groove through the planarization layer via hole.

Optionally, the display substrate further includes:

a passivation layer located between the switch unit and the planarization layer, wherein a region, corresponding to the output electrode, of the passivation layer is provided with a passivation layer via hole, the passivation layer via hole is in communication with the planarization layer via hole, opening area of the planarization layer via hole and opening area of the passivation layer via hole at the communicated interface coincide with each other, an orthographic projection of the passivation layer via hole onto the base substrate is located within the orthographic projection region of the planarization layer via hole onto the base substrate, and the pixel electrode is in contact with the bottom surface of the groove through the planarization layer via hole and the passivation layer via hole; and an insulating layer and a common electrode on one side of the pixel electrode away from the planarization layer and along a direction away from the pixel electrode;

wherein the switch unit is a thin film transistor including a gate electrode, a gate insulating layer, an active layer, a source electrode and a drain electrode, and the drain electrode being the output electrode.

Optionally, the common electrode is a plate electrode and the pixel electrode is a strip electrode.

In yet another aspect, a display device is provided, which includes any of the display substrates mentioned above in the another aspect.

BRIEF DESCRIPTION OF THE DRAWINGS

In order to describe the technical solutions in the embodiments of the present disclosure more clearly, the following briefly introduces the accompanying drawings required for describing the embodiments. Apparently, the accompanying drawings as described in the following show merely some embodiments of the present disclosure, and a person of ordinary skill in the art can also derive other drawings from these accompanying drawings without any creative effort.

DETAILED DESCRIPTION

For clearer descriptions of the objects, technical solutions and advantages of the present disclosure, implementations of the present disclosure will be described in further detail below with reference to the accompanying drawings.

Currently, in the era of Internet of things, the semiconductor electronic information industries such as the display industry and the sensor industry are playing a very important role. In the display industry, the display substrate usually includes a base substrate, and a TFT, a planarization layer and a pixel electrode on the substrate, wherein the TFT includes a gate electrode, a gate insulating layer, an active layer, a source electrode and a drain electrode, and the planarization layer has a via hole through which the pixel electrode is connected to the drain electrode. Generally, during the process of manufacturing the planarization layer, air media such as moisture and/or oxygen gas in the air may oxidize the source electrode and the drain electrode of the TFT, and lead to metal oxide films being formed on the surfaces of the source electrode and the drain electrode. As a result, in the finally manufactured display substrate, the contact resistance between the pixel electrode and the drain electrode is relatively great, the switching characteristic of the TFT is relatively poor, and the power consumption of the display substrate is relatively high.

In the display substrate, manufacturing method thereof and display device provided by the embodiments of the present disclosure, by etching the surface of the region, corresponding to the planarization layer via hole, of the output electrode (drain electrode of the TFT for example) of the switch unit, the oxidized portion on the surface of the region, corresponding to the planarization layer via hole, of the output electrode can be removed; the pixel electrode is in contact with the output electrode through the planarization layer via hole, so that the contact resistance between the pixel electrode and the output electrode is relatively small, the switching characteristic of the TFT is relatively good, and the power consumption of the display substrate is relatively low.

Figure 1:
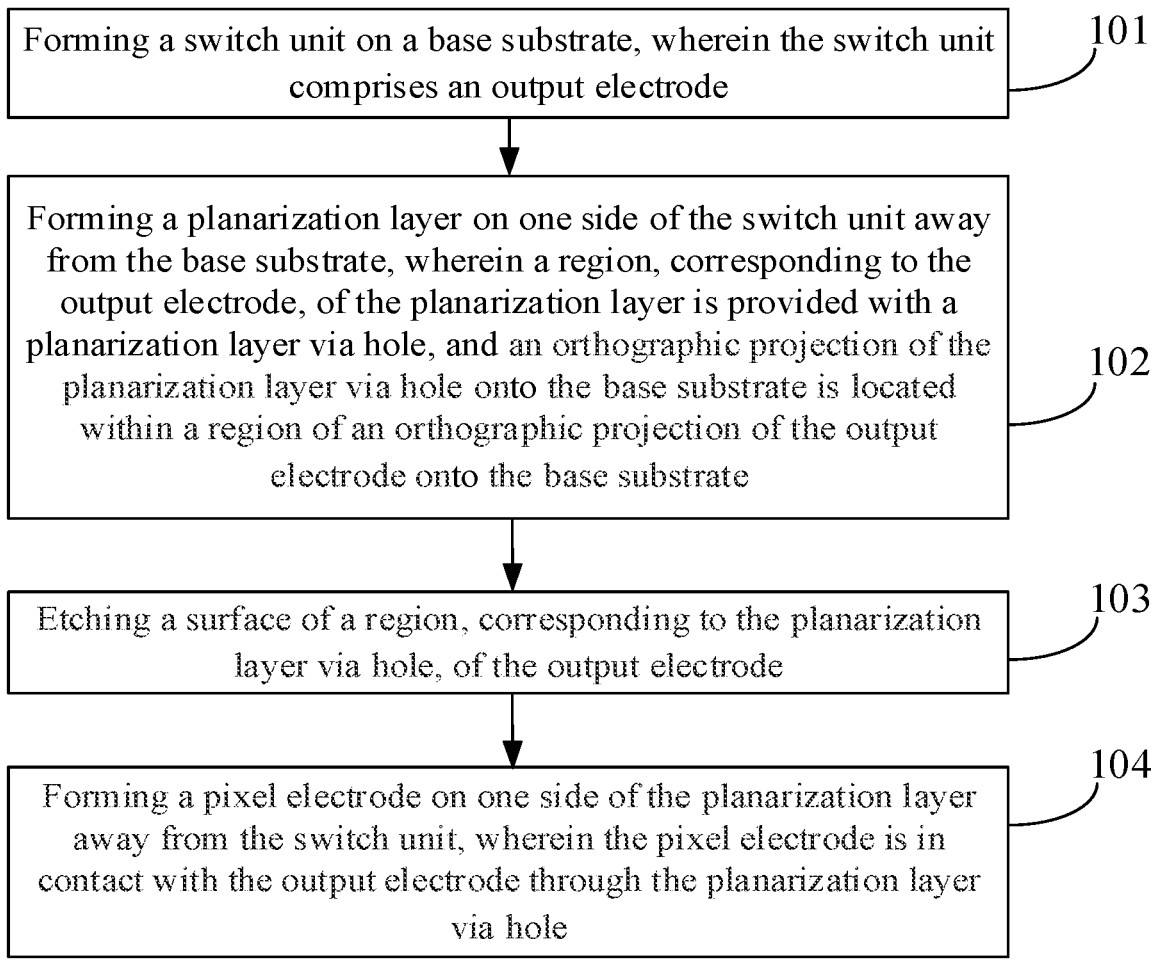
FIG. 1 is a flowchart showing a method of manufacturing a display substrate according to an embodiment of the present disclosure.

Referring to FIG. 1, it illustrates a flowchart of a method of manufacturing a display substrate according to an embodiment of the present disclosure. Referring to FIG. 1, the method may include the following steps.

In Step 101, a switch unit is formed on a base substrate, wherein the switch unit includes an output electrode.

In Step 102, a planarization layer is formed on one side of the switch unit away from the base substrate, wherein a region, corresponding to the output electrode, of the planarization layer has a planarization layer via hole, and an orthographic projection of the planarization layer via hole onto the base substrate is located within an orthographic projection region of the output electrode onto the base substrate.

In Step 103, a surface of a region, corresponding to the planarization layer via hole, of an output electrode is etched.

In Step 104, a pixel electrode is formed on one side of the planarization layer away from the switch unit, wherein the pixel electrode is in contact with the output electrode through the planarization layer via hole.

In summary, in the method of manufacturing the display substrate provided by the embodiments of the present disclosure, by etching the surface of the region, corresponding to the planarization layer via hole, of the output electrode of the switch unit, the oxidized portion on the surface of the region, corresponding to the planarization layer via hole, of the output electrode can be removed, so that the pixel electrode passes through the planarization layer via hole to contact the output electrode. In this way, the contact resistance between the pixel electrode and the output electrode is relatively small, the switching characteristic of the TFT is relatively good, and the power consumption of the display substrate is relatively low.

Figure 2:
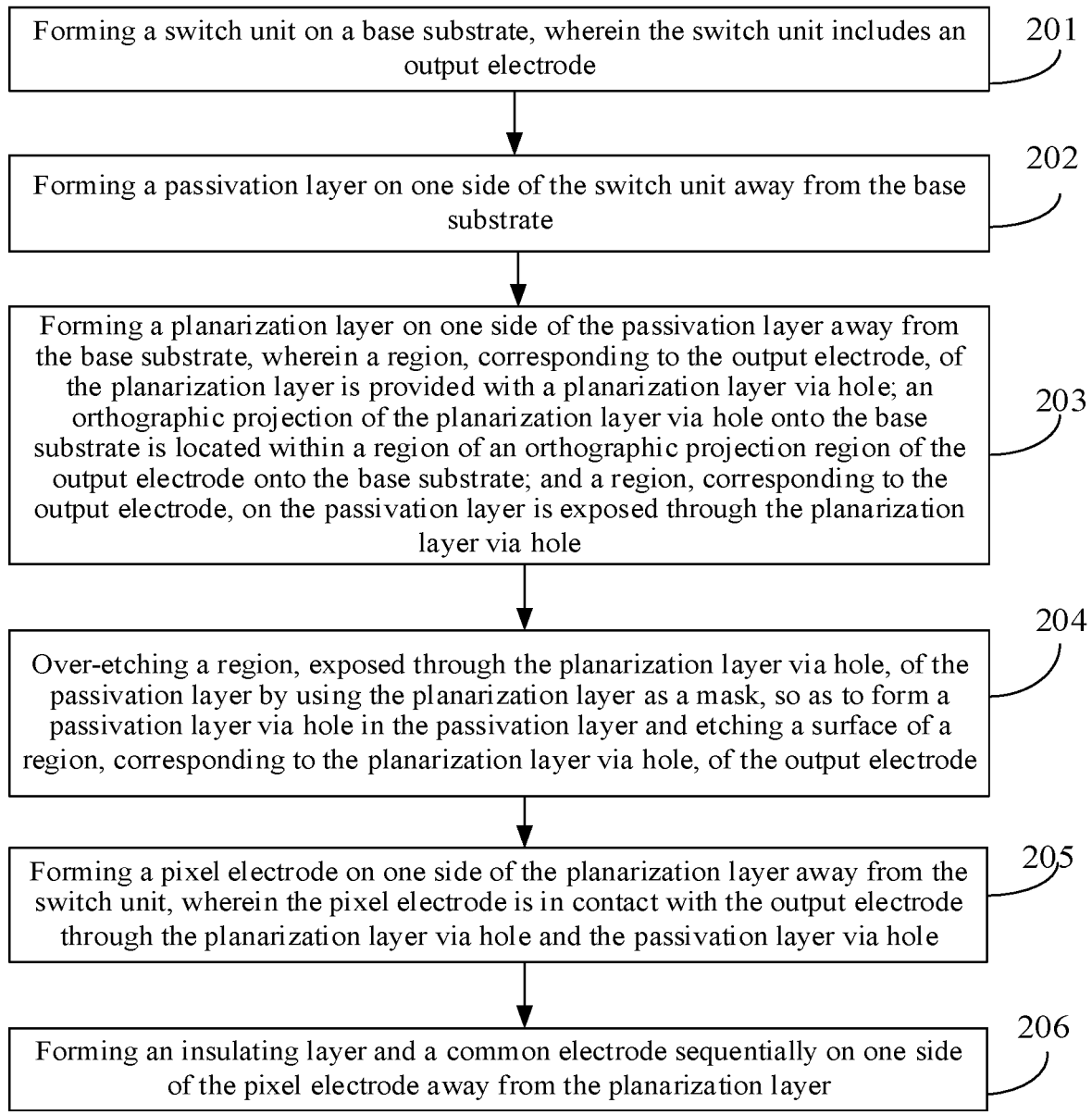
FIG. 2 is a flowchart of another method of manufacturing a display substrate according to an embodiment of the present disclosure.

Referring to FIG. 2, it illustrates a flowchart of another method of manufacturing a display substrate according to an embodiment of the present disclosure. Referring to FIG. 2, the method may include the following steps.

In Step 201, a switch unit is formed on the base substrate, wherein the switch unit includes an output electrode.

The switch unit may include a control electrode, a semiconductor layer, an input electrode and an output electrode, wherein the input electrode and the output electrode are not in contact with each other, but are in contact with the semiconductor layer respectively. Exemplarily, the switch unit may be a TFT. The TFT may be a top-gate type TFT or a bottom-gate type TFT, and both types include a gate electrode, a gate insulating layer, an active layer, a source electrode and a drain electrode, the source electrode and the drain electrode being not in contact with each other, but being in contact with the active layer respectively. In the embodiments of the present disclosure, when the switch unit is the TFT, it is possible that, the gate electrode is the control electrode, the active layer is the semiconductor layer, the source electrode is the input electrode, and the drain electrode is the output electrode.

Figure 3:
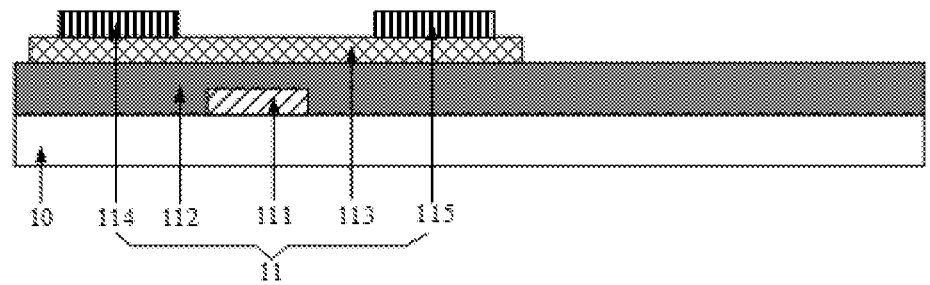
FIG. 3 is a schematic diagram showing that a switch unit has been formed on a base substrate according to an embodiment of the present disclosure.

Exemplarily, referring to FIG. 3, it illustrates a schematic diagram showing that a switch unit 11 has been formed on a base substrate 10 according to an embodiment of the present disclosure. In FIG. 3, it takes the switch unit 11 being the bottom-gate type TFT as an example for illustration. Referring to FIG. 3, the switch unit 11 includes a gate electrode 111, a gate insulating layer 112, an active layer 113, a source electrode 114 and a drain electrode 115. The source electrode 114 is not in contact with the drain electrode 115, but the source electrode 114 and the drain electrode 115 are in contact with the active layer 113 respectively. Here, the portions on the active layer 113 which are in contact with the source electrode 114 and the drain electrode 115 are all subject to a conductive treatment. The gate electrode 111 may be a control electrode, the source electrode 114 may be an input electrode, and the drain electrode 115 may be an output electrode. As shown in FIG. 3, the gate electrode 111, gate insulating layer 112, the active layer 113, and the source-drain electrode layer (not marked in FIG. 3) are arranged in sequence along a direction away from the base substrate 10, and the switch unit 11 is a bottom-gate type TFT.

The gate electrode 111, the source electrode 114 and drain electrode 115 may be all made of a metal material or alloy material. For example, the material of the gate electrode 111 may be one selected from metal materials such as molybdenum (Mo), copper (Cu) and aluminum (Al), or the alloy material of some of Mo, Cu and Al. The source electrode 114 and the drain electrode 115 are usually made of the same material. For example, both the source electrode 114 and the drain electrode 115 can be made of one selected from metal materials of titanium (Ti), Mo, Cu and Al, or the alloy material of some of Ti, Mo, Cu and Al. The gate insulating layer 112 may be made of transparent insulating material. For example, the material of the gate insulating layer 112 may be one Of Silicon dioxide ($SiO_2$), silicon oxide ($SiO_x$), silicon nitride ($SiN_x$), aluminum oxide ($Al_2O_3$) and silicon oxynitride ($SiO_xN_x$) or a combination thereof. The active layer 113 may be made of a semiconductor material. For example, the material of the active layer 113 may be one Of Oxides, amorphous silicon (a-Si) and polycrystalline silicon (p-Si), wherein the oxides may be an indium gallium zinc oxide (IGZO) active layer or indium tin zinc oxide (ITZO).

Exemplarily, by taking the gate electrode 111 being made of metal Al, the gate insulating layer 112 being made of $SiO_2$, the active layer 113 being made of IGZO, and both the source electrode 114 and the drain electrode 115 being made of Ti as an example, the formation of the switch unit 11 on the base substrate 10 may include: firstly, forming a metal Al material layer on the base substrate 10 through any of processes such as sputtering and thermal evaporation, and obtaining the gate electrode 111 by processing the metal Al material layer through a single patterning process; next, forming the gate insulating layer 112 on one side of the gate electrode 111 away from the base substrate 10 by using $SiO_2$ as the material through any of the processes such as depositing, coating and sputtering; then, forming an IGZO material layer on one side of the gate insulating layer 112 away from the base substrate 10 through any of the processes such as depositing, coating and sputtering, obtaining the active layer 113 by processing the IGZO material layer through a single patterning process, and performing a conductive treatment on the portions of the active layer 113 which are to be in contact with the source electrode and drain electrode to be formed, through the processes such as doping; finally, forming a metal Ti material layer on one side of the active layer 113 away from the base substrate 10 through any of the processes such as sputtering and thermal evaporation, and obtaining the source electrode 114 and the drain electrode 115 by processing the metal Ti material layer through a single patterning process. Here, the deposition process may be a plasma enhanced chemical vapor deposition (PECVD) process.

In Step 202, a passivation layer is formed on one side of the switch unit away from the base substrate.

Figure 4:
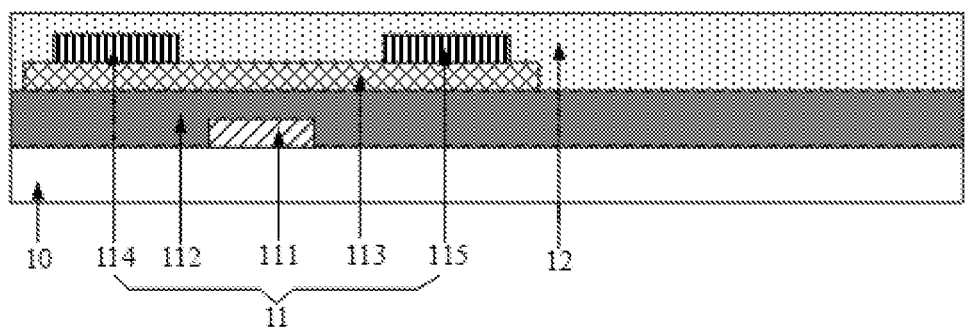
FIG. 4 is a schematic diagram showing that a passivation layer has been formed on one side of the switch unit away from the base substrate according to an embodiment of the present disclosure.

Referring to FIG. 4, it illustrates a schematic diagram showing that a passivation layer 12 has been formed on one side of the switch unit 11 away from the base substrate 10 according to an embodiment of the present disclosure, wherein the passivation layer 12 covers the switch unit 11. Optionally, the passivation layer 12 may be made of one of $SiO_x$, $SiN_x$ and $SiO_xN_x$ or a combination thereof. Exemplarily, the passivation layer 12 may be formed on one side of the switch unit 11 away from the base substrate 11 by using $SiO_x$ as material through any of the processes such as depositing, coating and sputtering.

In Step 203, a planarization layer is formed on one side of the passivation layer away from the base substrate, wherein a region, corresponding to the output electrode, of the planarization layer is provided with a planarization layer via hole; an orthographic projection of the planarization layer via hole onto the base substrate is located within an orthographic projection region of the output electrode onto the base substrate; and a region, corresponding to the output electrode, of the passivation layer is exposed through the planarization layer via hole.

Figure 5:
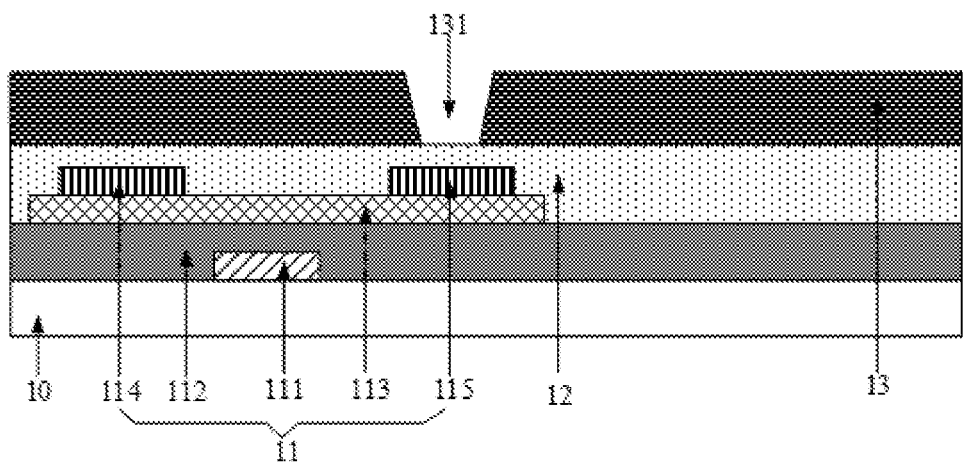
FIG. 5 is a schematic diagram showing that a planarization layer has been formed on one side of the passivation layer away from the base substrate according to an embodiment of the present disclosure.

Referring to FIG. 5, it illustrates a schematic diagram showing that a planarization layer 13 has been formed on one side of the passivation layer 12 away from the base substrate 10 according to an embodiment of the present disclosure, wherein a region, corresponding to the drain electrode 115 (i.e., the output electrode), of the planarization layer 13 is provided with a planarization layer via hole 131; an orthographic projection of the planarization layer via hole 131 onto the base substrate 10 is located within an orthographic projection region of the drain electrode 115 onto the base substrate 10; and a region, corresponding to the drain electrode 115, of the passivation layer 12 is exposed through the planarization layer via hole 131. Here, the planarization layer via hole 131 may be a cylindrical via hole, a quadrangular prism via hole or a truncated cone via hole, which is not limited in the embodiments of the present disclosure. Optionally, the planarization layer 13 may be made of organic transparent material or inorganic transparent material. The organic transparent material may be an organic resin; and the inorganic transparent material may be one of $SiO_x$, $SiN_x$, $Al_2O_3$ and $SiO_xN_x$ or a combination thereof.

Exemplarily, first, a resin material layer is formed on one side of the passivation layer 12 away from the base substrate 10 by using organic resin as a material through any of the processes such as depositing, magnetron sputtering and thermal evaporation; then, the planarization layer via hole 131 is formed in the resin material layer by sequentially exposing and developing the resin material layer; finally, the planarization layer 13 is obtained by curing the resin material layer on which the planarization layer via hole 131 has been formed. Here, by curing the resin material layer, the moisture in the resin material layer can be removed, so as to prevent the output electrode (i.e., the drain electrode 115) in the switch unit 11 from being influenced by the moisture in the resultant planarization layer.

In Step 204, a region, exposed through the planarization layer via hole, of the passivation layer is over-etched by using the planarization layer as a mask, so as to form a passivation layer via hole in the passivation layer; and to etch a surface of a region, corresponding to the planarization layer via hole, of the output electrode.

After over-etching the region, exposed through the planarization layer via hole, of the passivation layer by using the planarization layer as the mask, a passivation layer via hole can be formed in the passivation layer and a groove can be formed on the surface of the region, corresponding to the planarization layer via hole, of the output electrode. The depth of the groove may be from 50 angstroms to 300 angstroms. The passivation layer via hole is in communication with the planarization layer via hole, and the orthographic projection of the passivation layer via hole onto the base substrate is located within an orthographic projection region of the planarization layer via hole onto the base substrate. The passivation layer via hole may be a cylindrical via hole, a quadrangular prism via hole or a truncated cone via hole, which is not limited in the embodiments of the present disclosure.

Figure 6:
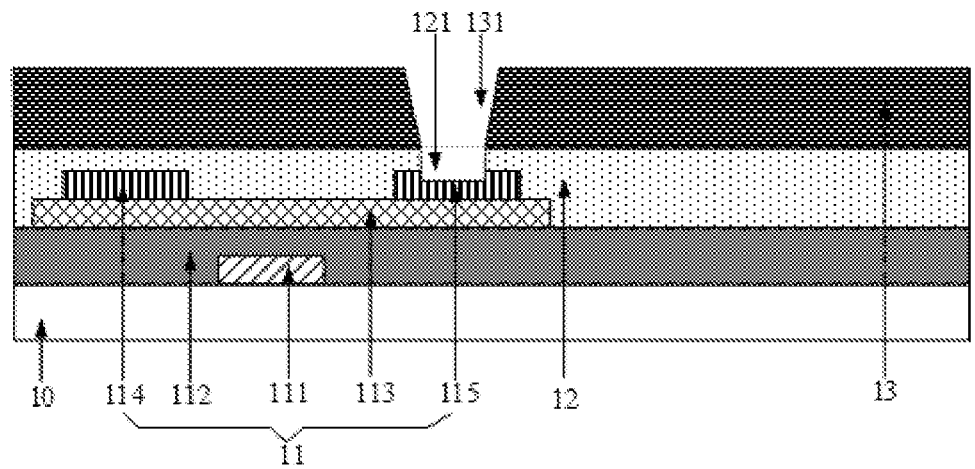
FIG. 6 is a schematic diagram showing that a portion, exposed through the planarization layer via hole, of the passivation layer has been over-etched according to an embodiment of the present disclosure.

Exemplarily, referring to FIG. 6, it illustrates a schematic diagram showing that a region, exposed through the planarization layer via hole 131, of the passivation layer 12 has been over-etched according to an embodiment of the present disclosure, wherein the region, exposed through the planarization layer via hole 131, of the passivation layer 12 is over-etched through the dry etching process by using the planarization layer 13 as a mask. As shown in FIG. 6, after over-etching the region, exposed through the planarization layer via hole 131, of the passivation layer 12 by using the planarization layer 13 as the mask, a passivation layer via hole 121 can be formed in the passivation layer 12, and an oxidized portion on a surface of a region, corresponding to the planarization layer via hole 131, of the output electrode (i.e., the drain electrode 115) can be removed; after removing the oxidized portion on the surface of the region, corresponding to the planarization layer via hole 131, of the output electrode, a groove (not marked in FIG. 6) can be formed on the surface of the region, corresponding to the planarization layer via hole 131, of the output electrode. The passivation layer via hole 121 is in communication with the planarization layer via hole 131, the orthographic projection of the passivation layer via hole 121 onto the base substrate 10 is located within the orthographic projection region of the planarization layer via hole 131 onto the base substrate 10, and the opening area of the passivation layer via hole 121 and the opening area of the planarization layer via hole 131 at the communicated interface coincide with each other, so that the alignment accuracy of the passivation layer via hole 121 and the planarization layer via hole 131 is high, and misalignment is not prone to occur. In the embodiments of the present disclosure, when the surface of the region, exposed through the planarization layer via hole 131, of the drain electrode 115 is etched by a dry etching process, the depth of the etched groove is usually from 50 angstroms to 100 angstroms.

In Step 205, a pixel electrode is formed on one side of the planarization layer away from the switch unit, wherein the pixel electrode is in contact with the output electrode through the planarization layer via hole and the passivation layer via hole.

Figure 7:
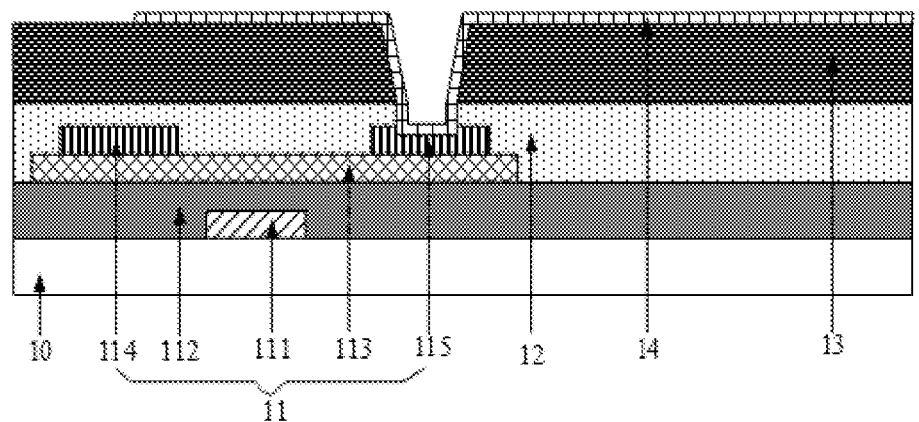
FIG. 7 is a schematic diagram showing that a pixel electrode has been formed on one side of the planarization layer away from the switch unit according to an embodiment of the present disclosure.

Exemplarily, referring to FIG. 7, it illustrates a schematic diagram showing that the pixel electrode 14 has been formed on one side of the planarization layer 13 away from the switch unit 11 according to an embodiment of the present disclosure. Referring to FIG. 7 in combination with FIG. 6, the pixel electrode 14 passes through the planarization layer via hole 131 and the passivation layer via hole 121 to contact with the drain electrode 115 (i.e., the output electrode), and more specifically with the bottom surface of the groove of the drain electrode 115, and the pixel electrode 14 may be a strip electrode.

The pixel electrode 14 may be made of transparent conductive material which may be one of indium tin oxide (ITO), indium zinc oxide (IZO) and aluminum-doped zinc oxide (ZnO:Al) or a combination thereof. Exemplarily, the ITO material layer may be formed on one side of a planarization layer 13 away from the switch unit 11 by any of the processes such as depositing, magnetron sputtering and thermal evaporation, and the pixel electrode 14 is obtained by processing the ITO material layer through a single patterning process.

In Step 206, an insulating layer and a common electrode are formed in sequence on one side of the pixel electrode away from the planarization layer.

Figure 8:
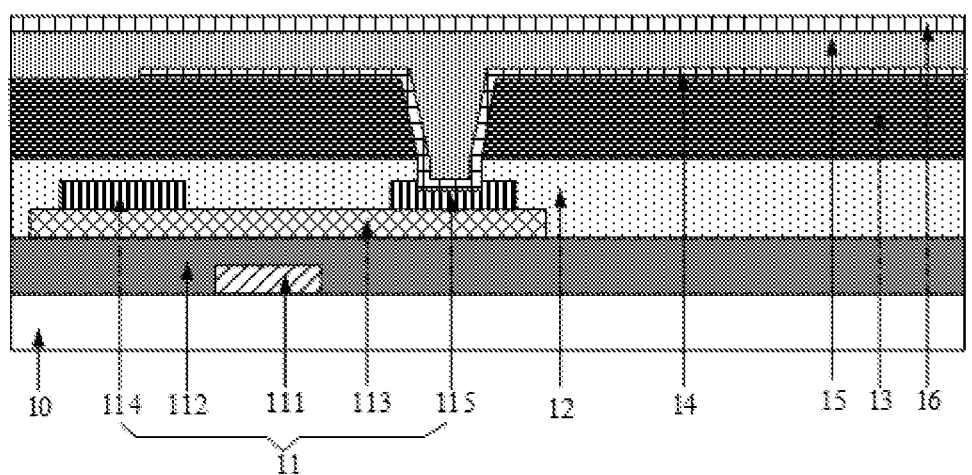
FIG. 8 is a schematic diagram showing that an insulating layer and a common electrode have been formed on one side of the pixel electrode away from the planarization layer according to an embodiment of the present disclosure.

Exemplarily, referring to FIG. 8, it illustrates a schematic diagram showing that an insulating layer 15 and a common electrode 16 have been formed in sequence on one side of the pixel electrode 14 away from the planarization layer 13 according to an embodiment of the present disclosure, wherein the insulating layer 15 covers the pixel electrode 14, and the common electrode 16 may be a plate electrode.

The insulating layer 15 may be made of a transparent insulating material. For example, the material of the insulating layer 15 may be one of $SiO_2$, $SiO_x$, $SiN_x$, $Al_2O_3$ and $SiO_xN_x$ or a combination thereof. The common electrode 16 may be made of a transparent conductive material. For example, the material of the common electrode 16 may be one of ITO, IZO and ZnO:Al or a combination thereof.

Exemplarily, by taking the material of the insulating layer 15 being $SiO_2$ and the material of the common electrode 16 being ITO as an example, forming the insulating layer 15 and the common electrode 16 on one side of the pixel electrode 14 away from the planarization layer 13 may include: firstly, depositing a layer of $SiO_2$ as the insulating layer 15 on one side of the pixel electrode 14 away from the planarization layer 13, through any of the processes such as depositing, coating and sputtering; then, forming the ITO material layer on one side of the insulating layer 15 away from the planarization layer 13 through one of the processes such as depositing, magnetron sputtering and thermal evaporation, and obtaining the common electrode 16 by processing the ITO material layer through a single patterning process.

It is easy for those skilled in the art to understand that FIG. 8 shows a structure of a display substrate, but the display substrate shown in FIG. 8 is merely exemplary and cannot be used to limit the display substrate actually manufactured according to the embodiments of the present disclosure. In addition to the structure shown in FIG. 8, the display substrate may further include structures such as a gate line and a data line. The gate line is usually connected with the gate electrode, and the data line is usually connected with the source electrode, which will not be repeated in the embodiment of the present disclosure here.

In summary, in the method of manufacturing the display substrate provided by the embodiments of the present disclosure, by etching the surface of the region, corresponding to the planarization layer via hole, of the output electrode of the switch unit, the oxidized portion on the surface of the region, corresponding to the planarization layer via hole, of the output electrode can be removed, and the pixel electrode is in contact with the output electrode through the planarization layer via hole. In this way, the contact resistance between the pixel electrode and the output electrode is relatively small, the switching characteristic of the switch unit is relatively good, and the power consumption of the display substrate is relatively low. In addition, as the etching on the surface of the region, corresponding to the planarization layer via hole, of the output electrode is performed by using the planarization layer as the mask, the manufacturing process of display substrate can be simplified.

In the technologies known to the inventor, the passivation layer and the planarization layer are manufactured through two patterning processes. Due to the limitation of manufacturing accuracy, the via hole in the passivation layer and the via hole in the planarization layer are prone to misalignment. In this way, the contact area between the pixel electrode and the drain electrode may be small and even failed, resulting in that the TFT cannot drive the pixel electrode sufficiently or even cannot drive the pixel electrode. In the embodiments of the present disclosure, the passivation layer via hole is formed by using the planarization layer as the mask; thus the passivation layer via hole and the planarization layer via hole can be self-aligned. In this way, the alignment accuracy of the passivation layer via hole and the planarization layer via hole are high, so that the misalignment between the planarization layer via hole and the passivation layer via hole can be avoided, and the effective contact between the pixel electrode and the output electrode can be ensured, thereby avoiding the condition that the pixel electrode cannot be sufficiently driven or even cannot be driven by the switch unit. The solutions provided by the embodiments of the present disclosure can meet the requirements of the display substrate for high frequency and low power consumption.

Figure 9:
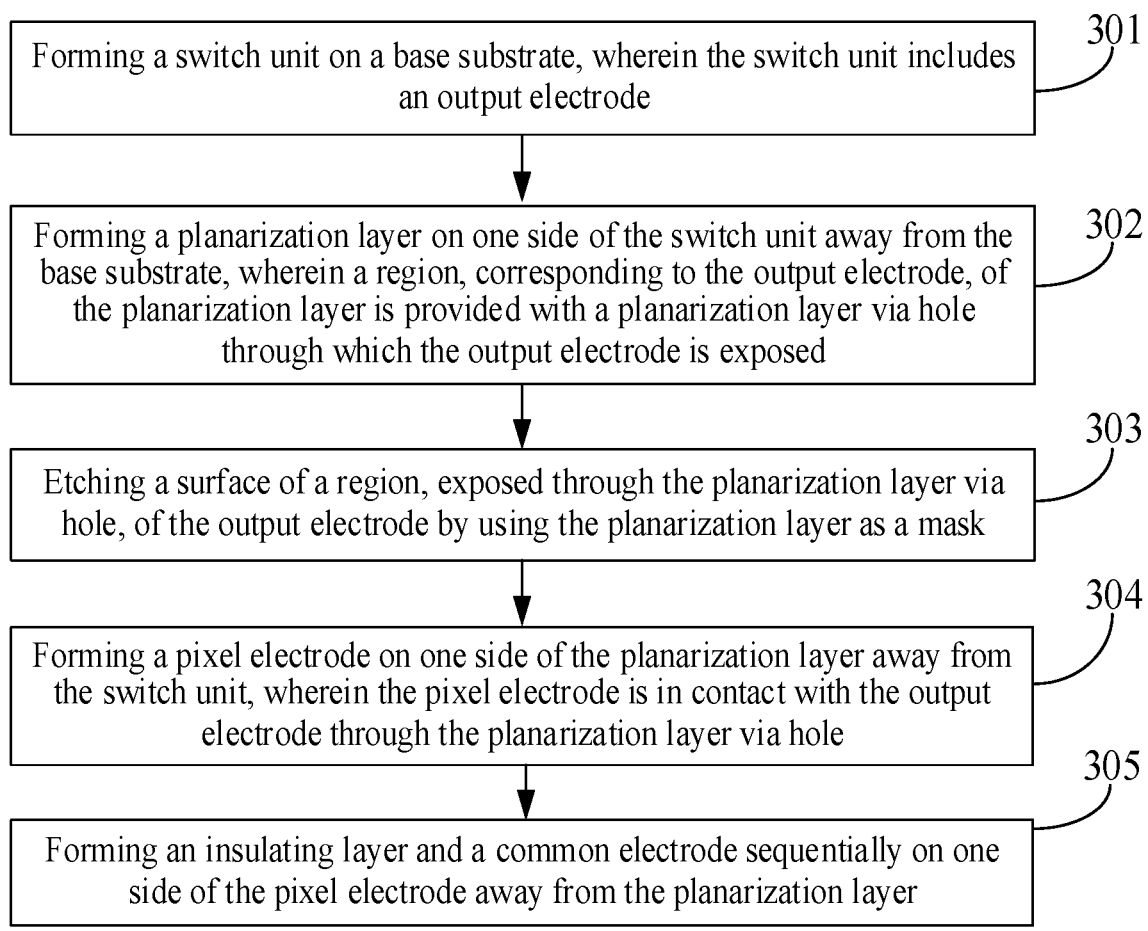
FIG. 9 is a flowchart of yet another method of manufacturing a display substrate according to an embodiment of the present disclosure.

Referring to FIG. 9, it illustrates a flowchart of yet another method of manufacturing a display substrate according to an embodiment of the present disclosure. Referring to FIG. 9, the method may include the following steps.

In Step 301, a switch unit is formed on a base substrate, wherein the switch unit includes an output electrode.

For the structure of the switch unit and the implementation process of Step 301, reference can be made to Step 201 of the embodiment shown in FIG. 2 and the figures corresponding to Step 201, which will not be repeated in the embodiment of the present disclosure here.

In Step 302, a planarization layer is formed on one side of the switch unit away from the base substrate, wherein a region, corresponding to the output electrode, of the planarization layer is provided with a planarization layer via hole, and the output electrode is exposed through the planarization layer via hole.

Figure 10:
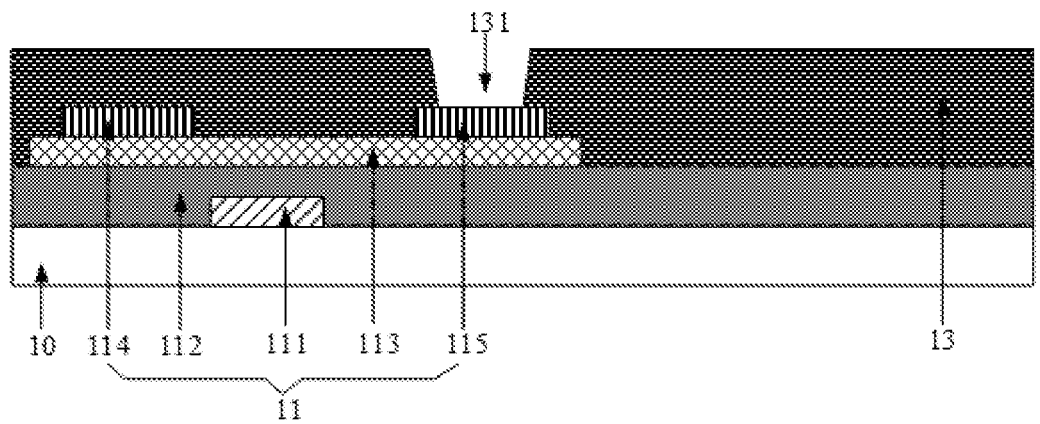
FIG. 10 is a schematic diagram showing that a planarization layer has been formed on one side of a switch unit away from the base substrate according to an embodiment of the present disclosure.

Exemplarily, referring to FIG. 10, it illustrates a schematic diagram showing that the planarization layer 13 has been formed on one side of the switch unit 11 away from the base substrate 10 according to an embodiment of the present disclosure, wherein the region, corresponding to the output electrode (i.e., the drain electrode 115), of the planarization layer 13 is provided with a planarization layer via hole 131, the orthographic projection of the planarization layer via hole 131 onto the base substrate 10 is located within the orthographic projection region of the output electrode onto the base substrate 10, and the output electrode is exposed through the planarization layer via hole 131.

Exemplarily, forming the planarization layer 13 on one side of the switch unit 11 away from the base substrate 10 may include: firstly, forming the resin material layer on the switch unit 11 away from the base substrate 10 by using organic resin as a material through any of the processes such as depositing, magnetron sputtering and thermal evaporation; then, forming the planarization layer via hole 131 in the resin material layer by sequentially exposing and developing the resin material layer; finally, obtaining the planarization layer 13 by curing the resin material layer on which the planarization layer via hole 131 has been formed for a target duration. The target duration may be less than or equal to 30 minutes. For example, the target duration may be 8 minute, 10 minutes, 15 minutes, 20 minutes or the like.

By curing the resin material layer, the moisture in the resin material layer can be removed, so as to prevent the output electrode (i.e., the drain electrode 115) in the switch unit 11 from being influenced by the moisture in the resultant planarization layer. It is easy for those skilled in the art to understand that the longer the resin material layer is cured, the more thoroughly the moisture in the resin material layer is removed. However, in the present embodiment, during the process of curing the resin material layer in which the planarization layer via hole 131 has been formed, the output electrode is exposed to the air and may be prone to oxidization by the air. Therefore, the target duration may be controlled to be less than or equal to 30 minutes in order to reduce the degree of oxidation of the output electrode, thereby reducing the impact of the curing process on the output electrode.

In Step 303, a surface of a region, exposed through the planarization layer via hole, of the output electrode is etched by using the planarization layer as a mask.

After etching the surface of the region, exposed through the planarization layer via hole, of the output electrode by using the planarization layer as the mask, a groove can be formed in the region, exposed through the planarization layer via hole, of the output electrode. The depth of the groove may be from 50 angstroms to 300 angstroms, and the actual depth of the groove depends on the etching processes as well as the parameters such as the duration during the etching.

Figure 11:
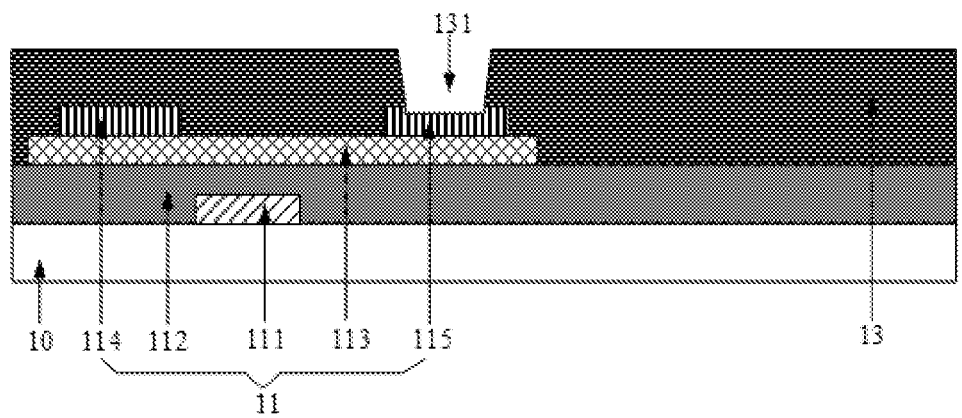
FIG. 11 is a schematic diagram showing that a surface of a region, corresponding to a planarization layer via hole, of an output electrode has been etched according to an embodiment of the present disclosure.

Exemplarily, referring to FIG. 11, it illustrates a schematic diagram showing that the region, corresponding to the planarization layer via hole 131, of the output electrode (i.e., the drain electrode 115) has been etched according to the embodiments of the present disclosure. The surface of the region, exposed through the planarization layer via hole 131, of the drain electrode 115 can be etched through a wet etching process, to form a groove (not shown in FIG. 11) on the surface of the region, exposed through the planarization layer via hole 131, of the drain electrode 115. In the embodiments of the present disclosure, when the surface of the region, exposed through the planarization layer via hole 131, of the drain electrode 115 is etched through the wet etching process, the depth of the etched groove is usually from 200 angstroms to 300 angstroms.

Exemplarily, the structure as shown in FIG. 10 can be placed in the etching solution. Under the protection of the planarization layer 13, the surface of the region, exposed through the planarization layer via hole 131, of the drain electrode 115 chemically reacts with the etching solution, so that the oxidized portion on the surface of the region, exposed through the planarization layer via hole 131, on the drain electrode 115 is removed, thereby forming a groove on the surface of the region, exposed through the planarization layer via hole 131, of the drain electrode 115.

In Step 304, a pixel electrode is formed on one side of the planarization layer away from the switch unit, wherein the pixel electrode is in contact with the output electrode through the planarization layer via hole.

Figure 12:
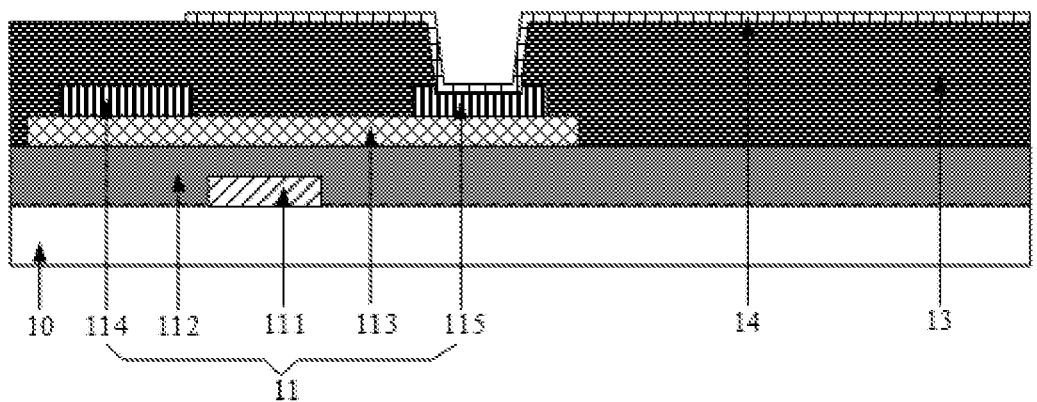
FIG. 12 is another schematic diagram showing that a pixel electrode has been formed on one side of the planarization layer away from the switch unit according to an embodiment of the present disclosure.

Exemplarily, FIG. 12 is another schematic diagram showing that a pixel electrode 14 has been formed on one side of the planarization layer 13 away from the switch unit 11 according to the embodiments of the present disclosure, wherein the pixel electrode 14 is in contact with the bottom surface of the groove of the output electrode (i.e., the drain electrode 115) through the planarization layer via hole, and the pixel electrode 14 may be a strip electrode.

In Step 305, an insulating layer and a common electrode are formed in sequence on one side of the pixel electrode away from the planarization layer.

Figure 13:
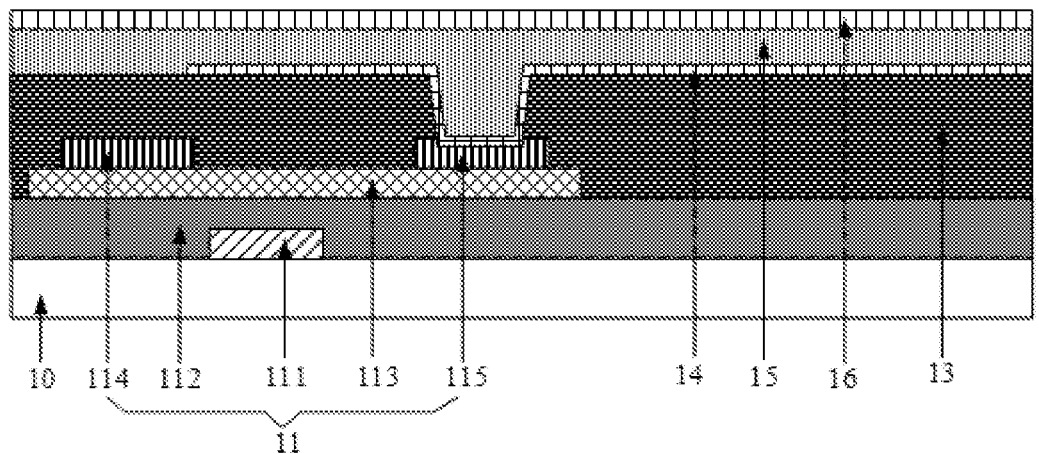
FIG. 13 is another schematic diagram showing that an insulating layer and a common electrode have been formed on one side of the pixel electrode away from the planarization layer according to an embodiment of the present disclosure.

Exemplarily, FIG. 13 is another schematic diagram showing that an insulating layer 15 and a common electrode 16 have been formed in sequence on one side of the pixel electrode 14 away from the planarization layer 13 according to an embodiment of the present disclosure.

For the implementation process of the foregoing Steps 304-305, reference can be made to Steps 205-206 of the embodiment shown in FIG. 2, which will not be repeated in the embodiment of the present disclosure here.

It is easy for those skilled in the art to understand that FIG. 13 shows a structure of a display substrate, but the display substrate shown in FIG. 13 is merely exemplary and cannot be used to limit the display substrate actually manufactured according to the embodiments of the present disclosure. In addition to the structure shown in FIG. 13, the display substrate may further include structures such as a gate line and a data line. The gate line is usually connected with the gate electrode, and the data line is usually connected with the source electrode, which will not be repeated in the embodiment of the present disclosure here.

In summary, in the method of manufacturing the display substrate provided by the embodiments of the present disclosure, by etching the surface of the region, corresponding to the planarization layer via hole, of the output electrode of the switch unit, the oxidized portion on the surface of the region, corresponding to the planarization layer via hole, of the output electrode can be removed, and the pixel electrode is in contact with the output electrode through the planarization layer via hole. In this way, the contact resistance between the pixel electrode and the output electrode is relatively small, the switching characteristic of the switch unit is relatively good, and the power consumption of the display substrate is relatively low. In addition, as the etching of the surface of the region, corresponding to the planarization layer via hole, of an output electrode is performed by using the planarization layer as the mask, the manufacturing process of display substrate can be simplified.

In the manufacturing method of the display substrate according to the embodiments of the present disclosure, the single patterning process as involved may include photoresist coating, exposure, development, etching and photoresist stripping. The processing of a material layer (such as an ITO material layer) by the single patterning process may include: firstly, coating the material layer (such as the ITO material layer) with a layer of photoresist to form a photoresist layer; next, exposing the photoresist layer with a mask, so that the photoresist layer forms a completely-exposed region and a non-exposed region; subsequently, removing the photoresist in the completely-exposed region completely and retaining all the photoresist in the non-exposed region through a developing process; hereafter, etching a region, corresponding to the completely-exposed region, of the material layer (such as the ITO material layer) through an etching process; and stripping the photoresist in the non-exposed region to obtain the corresponding structure (such as the pixel electrode 14). Here, the description is given by taking the photoresist being a positive photoresist as an example. When the photoresist is a negative photoresist, the process of the single patterning process may make a reference to the description in this paragraph and will not be repeated in the embodiment of the present disclosure here.

The sequence of steps in the method of manufacturing the display substrate according to the embodiments of the present disclosure can be adjusted appropriately, and the steps may also be added or omitted according to the specific situation. Within the technical scope disclosed by the present disclosure, any variant which can be easily thought of by those skilled in the art shall fall within the protection scope of the present disclosure, and therefore will not be repeated here.

Based on the same inventive concept, the embodiment of the present disclosure also provides a display substrate which may be a display substrate as shown in FIG. 8 or FIG. 13. As shown in FIG. 8 and FIG. 13, the display substrate includes a base substrate 10; a switch unit 11 located on the base substrate 10, wherein the switch unit 11 includes an output electrode, one side of output electrode away from the base substrate 10 is provided with a groove (not marked in FIG. 8 and FIG. 13), and the depth of the groove may be from 50 angstroms to 300 angstroms; a planarization layer 13 located on one side of the switch unit 11 away from the base substrate 10, wherein the region, corresponding to the output electrode, of the planarization layer 13 is provided with a planarization layer via hole (not marked in FIG. 8 and FIG. 13), and an orthographic projection of the planarization layer via hole onto the base substrate 10 is located within an orthographic projection region of the output electrode onto the base substrate 10; and a pixel electrode 14 located on one side of the planarization layer 13 away from the switch unit 11, wherein the pixel electrode 14 is in contact with the bottom surface of the groove of the output electrode through the planarization layer via hole, and the groove is obtained by etching one side of the output electrode away from the base substrate 10.

Optionally, the switch unit 11 may be a TFT. The TFT may be a top-gate type TFT or a bottom-gate type TFT, and both types include a gate electrode, a gate insulating layer, an active layer, a source electrode and a drain electrode, wherein the output electrode of the switch unit 11 may be the drain electrode. Exemplarily, the description is given by taking the switch unit 11 being a bottom-gate TFT as an example in the embodiment of the present disclosure. As shown in FIG. 8 and FIG. 13, the switch unit 11 includes a gate electrode 111, a gate insulating layer 112, an active layer 113 and a source-drain electrode layer including a source electrode 114 and a drain electrode 115, which are arranged in sequence along a direction away from the base substrate 10. The output electrode of the switch unit 11 may be the drain electrode 115. The pixel electrode 14 is in contact with the bottom surface of the groove of the output electrode, i.e., in the display substrate shown in FIG. 8 and FIG. 13, the pixel electrode 14 is in contact with the bottom surface of the groove of the drain electrode 115.

Optionally, as shown in FIG. 8, the display substrate may further include a passivation layer 12 which is located between the switch unit 11 and the planarization layer 13. The region, corresponding to the output electrode (i.e., the drain electrode 115) of the switch unit 11, of the passivation layer 12 is provided with a passivation layer via hole (not marked in FIG. 8), wherein the passivation layer via hole is in communication with the planarization layer via hole, an orthographic projection of the passivation layer via hole onto the base substrate 10 is located within the orthographic projection region of the planarization layer via hole onto the base substrate 10, and the pixel electrode 14 is in contact with the bottom surface of the groove of the output electrode (i.e., the drain electrode 115) of the switch unit 11 through the planarization layer via hole and the passivation layer via hole.

Optionally, as shown in FIG. 8, opening area of the planarization layer via hole and opening area of the passivation layer via hole at the communicated interface coincide with each other. In this way, the alignment accuracy of the planarization layer via hole and the passivation layer via hole is high, thereby the effective contact between the pixel electrode and the output electrode can be ensured.

Optionally, as shown in FIG. 8 and FIG. 13, the display substrate may further include: an insulating layer 15 and a common electrode 16 located on one side of the pixel electrode 14 away from the planarization layer 13 and along the direction away from the pixel electrode 14. The common electrode 16 may be a plate electrode, and the pixel electrode 14 may be a strip electrode. The insulating layer 15 can lead to the pixel electrode 14 and the common electrode 16 to be insulated.

In summary, in the display substrate provided by the embodiments of the present disclosure, the pixel electrode is in contact with the bottom surface of the groove of the output electrode of the switch unit, wherein the groove is obtained by etching one side of the output electrode away from the base substrate, and through the etching, the oxidized portion on one side of the output electrode away from the base substrate can be removed, so that the bottom surface of the groove remains unoxidized. In this way, the contact resistance between the pixel electrode and the output electrode is relatively small, the switching characteristic of the switch unit is relatively good, and the power consumption of the display substrate is relatively low.

Based on the same inventive concept, the embodiment of the present disclosure also provides a display device which includes the display substrate according to the foregoing embodiments. The display device may be any product or component with a display function. For example, the display device may be an electronic paper, a mobile phone, a tablet computer, a television, a notebook computer, a display, a digital photo frame, a navigator, a watch, or a bracelet and so on.

The term "and/or" in the embodiments of the present disclosure merely describes the association relationship between the associated objects and indicates that there may be three relationships. For example, A and/or 13 may indicate three cases where only A exists, A and B exist at the same time, and only B exists. The character "/" in the present disclosure generally indicates that the relationship between the former and later associated objects is "OR".

The foregoing descriptions are merely optional embodiments of the present disclosure, and are not intended to limit the present disclosure. Within the spirit and principles of the disclosure, any modifications, equivalent substitutions, improvements, etc., are within the protection scope of the present disclosure.

What is claimed is:

1. A method of manufacturing a display substrate, comprising:
    forming a switch unit on a base substrate, wherein the switch unit comprises an output electrode;
    forming a planarization layer on one side of the switch unit away from the base substrate, wherein a region, corresponding to the output electrode, of the planarization layer is provided with a planarization layer via hole, and an orthographic projection of the planarization layer via hole onto the base substrate is located within an orthographic projection region of the output electrode onto the base substrate;
    etching a surface of a region, exposed through the planarization layer via hole, of the output electrode through a wet etching process by using the planarization layer as a mask, to remove an oxidized portion formed on the surface of the region when curing the planarization layer; and forming a pixel electrode on one side of the planarization layer away from the switch unit, wherein the pixel electrode is in contact with the output electrode through the planarization layer via hole, wherein the method further comprises:

forming an insulating layer and a common electrode sequentially on one side of the pixel electrode away from the planarization layer, wherein after forming the planarization layer on one side of the switch unit away from the base substrate, the method further comprises:

curing the planarization layer for less than or equal to 20 minutes, wherein the planarization layer is in direct contact with the switch unit, and the planarization layer is a single-layer structure.

2. The method according to claim 1, wherein the switch unit is a thin film transistor, and the forming the switch unit on the base substrate comprises:

forming a gate electrode, a gate insulating layer, an active layer and a source-drain electrode layer on the base substrate, wherein the source-drain electrode layer comprises a source electrode and a drain electrode, and the drain electrode is the output electrode.

3. A display substrate, comprising:

a base substrate;

a switch unit on the base substrate, wherein the switch unit comprises an output electrode, one side of the output electrode away from the base substrate is provided with a groove, and a depth of the groove is between 50 and 300 angstroms;

a planarization layer on one side of the switch unit away from the base substrate, wherein a region, corresponding to the output electrode, of the planarization layer is provided with a planarization layer via hole, and an orthographic projection of the planarization layer via hole onto the base substrate is located within an orthographic projection region of the output electrode onto the base substrate; and a pixel electrode on one side of the planarization layer away from the switch unit, wherein the pixel electrode is in contact with a bottom surface of the groove through the planarization layer via hole, wherein the display substrate further comprises an insulating layer and a common electrode formed sequentially on one side of the pixel electrode away from the planarization layer, wherein the planarization layer is cured for less than or equal to 20 minutes, wherein the planarization layer is in direct contact with the switch unit, and the planarization layer is a single-layer structure, wherein a surface of a region exposed through the planarization layer via hole of the output electrode is etched through a wet etching process by using the planarization layer as a mask, to remove an oxidized portion formed on the surface of the region of the output electrode when curing the planarization layer.

4. A display device, comprising a display substrate as defined in claim 3.

* * * * *